(12) United States Patent
Ogane et al.

(10) Patent No.: US 9,337,372 B2
(45) Date of Patent: *May 10, 2016

(54) PHOTOVOLTAIC DEVICE

(71) Applicant: Panasonic Intellectual Property Management Co., Ltd., Osaka-shi, Osaka (JP)

(72) Inventors: Akiyoshi Ogane, Osaka (JP); Yasufumi Tsunomura, Hyogo (JP)

(73) Assignee: PANASONIC INTELLECTUAL PROPERTY MANAGEMENT CO., LTD. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/134,496

(22) Filed: Dec. 19, 2013

(65) Prior Publication Data

US 2014/0102527 A1 Apr. 17, 2014

Related U.S. Application Data

(63) Continuation of application No. PCT/JP2012/057140, filed on Mar. 21, 2012.

(30) Foreign Application Priority Data

Jun. 30, 2011 (JP) ................................. 2011-145142

(51) Int. Cl.
*H01L 31/0747* (2012.01)
*H01L 31/075* (2012.01)
*H01L 31/0376* (2006.01)

(52) U.S. Cl.
CPC ........ *H01L 31/075* (2013.01); *H01L 31/03762* (2013.01); *H01L 31/0747* (2013.01); *Y02E 10/547* (2013.01); *Y02E 10/548* (2013.01)

(58) Field of Classification Search
None
See application file for complete search history.

(56) References Cited

U.S. PATENT DOCUMENTS

2003/0168660 A1* 9/2003 Terakawa et al. ............... 257/52
2003/0227017 A1 12/2003 Yasuno
2008/0230121 A1* 9/2008 Terakawa ...................... 136/261

FOREIGN PATENT DOCUMENTS

| JP | 2002-329878 A | 11/2002 |
| JP | 2003-258287 A | 9/2003 |
| JP | 2004-14812 A | 1/2004 |
| JP | 4070483 B2 | 1/2008 |

(Continued)

OTHER PUBLICATIONS

Kondo, et al. "Understanding of Passivation Mechanism in Heterojunction c-Si Solar Cells." Mater. Res. Soc. Symp. Proc., vol. 1066 (2008).*

(Continued)

*Primary Examiner* — James Lin
*Assistant Examiner* — William E McClain
(74) *Attorney, Agent, or Firm* — Cantor Colburn LLP

(57) ABSTRACT

A photovoltaic device may be provided having a semiconductor substrate, an i-type amorphous layer or an i-type amorphous layer formed over a front surface or a back surface of the semiconductor substrate, and a p-type amorphous layer or an n-type amorphous layer formed over the i-type amorphous layer or the i-type amorphous layer. The i-type amorphous layer or the i-type amorphous layer has an oxygen concentration profile in which a concentration is reduced in a step-shape from a region near an interface with the semiconductor substrate and along a thickness direction.

3 Claims, 3 Drawing Sheets

(56) References Cited

FOREIGN PATENT DOCUMENTS

| JP | 2008-235400 A | 10/2008 |
|---|---|---|
| WO | 2009094578 A2 | 7/2009 |

OTHER PUBLICATIONS

Fujiwara, et al. Optimization of interface structures in crystalline silicon heterojunction solar cells, Solar Energy Materials and Solar Cells, vol. 93, Jun. 2009, pp. 725-728.*

Extended European Search Report for Application No./Patent No. 12804030.0/1508/2728622 PCT/JP2012057140, issued Nov. 12, 2014.

Sritharathikun J. et al., "Optimization of amorphous silicon oxide buffer layer for high-efficiency p-type hydrogenated microcrystalline silicon oxide/n-type crystalline silicon heterojunction solar cells", Japanese Journal of Applied Physics, Japan Society of Applied Physics, JP, vol. 47, No. 11, Nov. 1, 2008, pp. 8452-8455.

H. Fujiwara et al., Application of hydrogenated amorphous silicom oxide layers to c-Si heterojunction solar cells, Applied Physics Letters, 91, Sep. 26, 2007, pp. 133508-3.

International Search Reported for International application No. PCT/JP2012/057140; Date of Mailing: Apr. 17, 2012, with English Translation.

T. Mueller et al., Crystalline silicon surface passivation by high-frequency plasma-enhanced chemical-vapor-deposited nanocomposite silicom suboxides for solar cell applications, Journal of Applied Physics, 107, (2010), pp. 014504-014511.

U.S. Non-Final Office Action for U.S. Appl. No. 14/134,743; Issued Apr. 8, 2015.

Mueller, et al. "Heterojunction Silicon Wafer Solar Cells using Amorphous Silicon Suboxides for Interface Passivation." Energy Procedia, vol. 15, 2012, pp. 97-106.

Japanese Notice of Grounds for Rejection corresponding to Patent Application No. 2015-098695; Date of Mailing: Mar. 1, 2016, with English translation.

* cited by examiner

PHOTOVOLTAIC DEVICE

CROSS-REFERENCE TO RELATED APPLICATIONS

The present application is a continuation under 35 U.S.C. §120 of PCT/JP2012/057140, filed Mar. 21, 2012, which is incorporated herein by reference and which claimed priority to Japanese Patent Application No. 2011-145142 filed on Jun. 30, 2011. The present application likewise claims priority under 35 U.S.C. §119 to Japanese Patent Application No. 2011-145142 filed on Jun. 30, 2011, the entire content of which is also incorporated herein by reference.

BACKGROUND

1. Technical Field

The present invention relates to a photovoltaic device.

2. Related Art

Photovoltaic devices are known in which an amorphous silicon layer which is substantially intrinsic is formed between a crystalline silicon substrate and a doped amorphous silicon layer.

As a means for improving an output characteristic of the photovoltaic device having such a structure, a structure is known in which an oxygen concentration of an interface portion between the silicon substrate and the intrinsic amorphous silicon layer is increased (refer to Japanese Patent No. 4070483). In addition, a structure is known in which a slope is provided in the oxygen concentration in the intrinsic amorphous silicon layer, with the oxygen concentration of the side of the doped amorphous silicon layer being higher (refer to JP 2008-235400 A).

On the other hand, it has been reported that in an inactivation technique of a surface of a silicon substrate by the intrinsic amorphous silicon layer, by containing oxygen in an appropriate amount in the entirety of the intrinsic amorphous silicon layer and forming a very small amorphous silicon oxide region within the layer, it is possible to promote the inactivation (refer to J. Appl. Phys. 107, 014504 (2010)). In addition, it has been reported that by containing oxygen in an appropriate amount in the entirety of the intrinsic amorphous silicon layer, the output characteristic of the photovoltaic device can be improved (refer to Appl. Phys. Lett. 91, 133508 (2007).

When excessive oxygen is introduced into the amorphous silicon layer, the oxygen may act as an impurity to form a defect or form a high-resistance region. Therefore, optimization of the oxygen concentration to be contained is desired. However, the optimum oxygen concentration profile in the intrinsic amorphous silicon layer, in particular, the oxygen concentration at the side of the interface between the silicon substrate and the intrinsic amorphous silicon layer, has not been sufficiently investigated.

SUMMARY

According to one aspect of the present invention, there is provided a photovoltaic device comprising: a crystalline semiconductor substrate of a first conductive type; a first amorphous semiconductor layer which is intrinsic and formed over a first surface of the semiconductor substrate; and a second amorphous semiconductor layer of the first conductive type or of a conductive type opposite to the first conductive type and formed over the first amorphous semiconductor layer, wherein the first amorphous semiconductor layer has an oxygen concentration profile in which a concentration is reduced in a step-shape from a region near an interface with the semiconductor substrate and along a thickness direction.

Advantageous Effects

According to various aspects of the present invention, a photovoltaic efficiency in the photovoltaic device can be improved.

DETAILED DESCRIPTION

Figure 1:
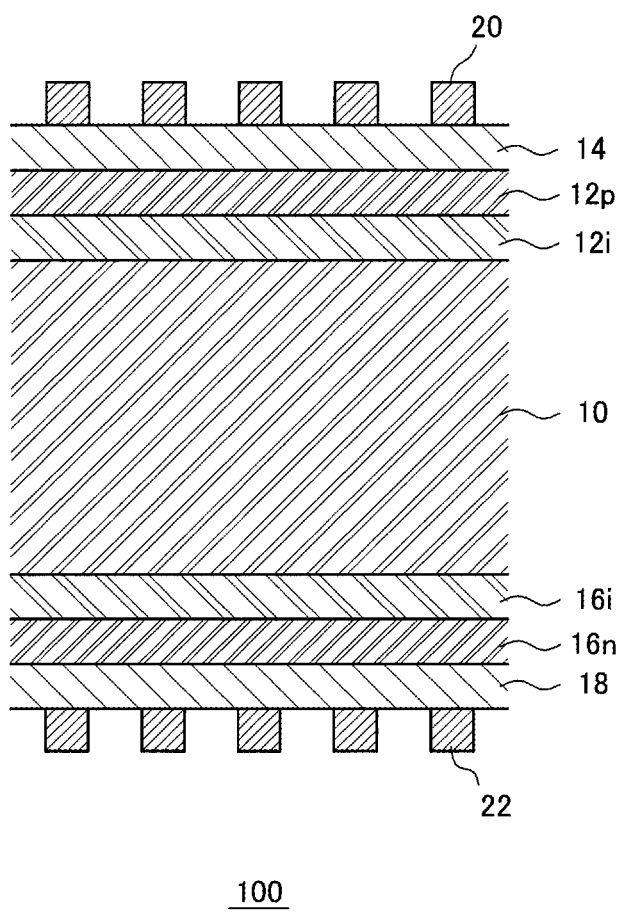
FIG. 1 is a cross-sectional diagram of a photovoltaic device according to a preferred embodiment of the present invention.

As shown in a cross-sectional diagram of FIG. 1, a photovoltaic device 100 according to a preferred embodiment of the present invention comprises a semiconductor substrate 10, an i-type amorphous layer 12$i$, a p-type amorphous layer 12$p$, a transparent conductive layer 14, an i-type amorphous layer 16$i$, an n-type amorphous layer 16$n$, a transparent conductive layer 18, and collecting electrodes 20 and 22.

A structure of the photovoltaic device 100 will now be described while showing a method of producing the photovoltaic device 100. TABLE 1 shows example formation conditions of amorphous layers in the photovoltaic device 100. The film formation conditions used in the present embodiment are merely exemplary, and may be suitably changed and optimized according to the device to be used.

TABLE 1

|  | PROCESS | SUBSTRATE TEMPERATURE [° C.] | GAS | PRESSURE [Pa] | POWER DENSITY [mW/cm$^2$] |
| --- | --- | --- | --- | --- | --- |
| FRONT SURFACE | HYDROGEN TREATMENT | 150~200 | H$_2$: 40 sccm | 50 | 2~4 |
|  | i-TYPE AMORPHOUS LAYER 12i | 150~200 | H$_2$: 200 sccm SiH$_4$: 20 sccm CO$_2$: 0~20 sccm | 50 | 2~4 |
|  | p-TYPE AMORPHOUS LAYER 12p | 150~200 | H$_2$: 200 sccm SiH$_4$: 20 sccm B$_2$H$_6$: 20 sccm | 50 | 2~4 |

TABLE 1-continued

| | PROCESS | SUBSTRATE TEMPERATURE [° C.] | GAS | PRESSURE [Pa] | POWER DENSITY [mW/cm$^2$] |
|---|---|---|---|---|---|
| BACK SURFACE | HYDROGEN TREATMENT | 150~200 | H$_2$: 40 sccm | 50 | 2~4 |
| | i-TYPE AMORPHOUS LAYER 16i | 150~200 | H$_2$: 200 sccm SiH$_4$: 20 sccm CO$_2$: 0~20 sccm | 50 | 2~4 |
| | n-TYPE AMORPHOUS LAYER 16n | 150~200 | H$_2$: 200 sccm SiH$_4$: 20 sccm PH$_3$: 20 sccm | 50 | 2~4 |

The semiconductor substrate 10 comprises a crystalline semiconductor material. The semiconductor substrate 10 may be a crystalline semiconductor substrate of an n-type conductivity or a p-type conductivity. As the semiconductor substrate 10, for example, a monocrystalline silicon substrate, a polycrystalline silicon substrate, a gallium arsenide substrate (GaAs), an indium phosphide substrate (InP) or the like may be employed. The semiconductor substrate 10 absorbs incident light and produces carrier pairs of electrons and holes through photoelectric conversion. In the following description, an example configuration will be described in which an n-type monocrystalline silicon substrate is used as the semiconductor substrate 10.

The semiconductor substrate 10 is placed in a film formation chamber after being cleaned. The cleaning of the semiconductor substrate 10 can be performed using an etchant of hydrofluoric acid (HF etchant) or an RCA cleaning solution. Alternatively, a texture structure may be preferably formed on a front surface or a back surface of the semiconductor substrate 10 using alkaline etchant such as a potassium hydroxide etchant (KOH etchant). In this case, the semiconductor substrate 10 having the (100)-plane may be anisotropically etched using the KOH etchant, to form a texture structure having a pyramid type (111)-plane.

Alternatively, a predetermined oxidization process may be applied before the formation of the i-type amorphous layer 12i to form an oxidized interface. As the predetermined oxidation process, for example, the substrate may be placed in an atmospheric air environment or in a humidity-controlled atmosphere for a predetermined period of time, or an ozone water process, a hydrogen peroxide water process, an ozonizer process, or the like may be suitably employed.

The i-type amorphous layer 12i which is an amorphous semiconductor layer is formed over a front surface of the semiconductor substrate 10. For example, the i-type amorphous layer 12i is an intrinsic hydrogenated amorphous silicon. Here, an intrinsic semiconductor layer refers to a semiconductor layer with a concentration of contained p-type or n-type dopant of less than or equal to 5×10$^{18}$/cm$^3$, or, when the p-type dopant and the n-type dopant are both contained, a semiconductor layer with a difference of the dopant concentrations of the p-type and n-type of less than or equal to 5×10$^{18}$/cm$^3$. The i-type amorphous layer 12i is preferably formed sufficiently thin to inhibit absorption of the light as much as possible and at the same time, sufficiently thick for passivation of the front surface of the semiconductor substrate 10. The thickness of the i-type amorphous layer 12i is preferably in a range of greater than or equal to 1 nm and less than or equal to 25 nm, and more preferably in a range of greater than or equal to 5 nm and less than or equal to 10 nm.

The i-type amorphous layer 12i can be formed through plasma-enhanced chemical vapor deposition (PECVD), Cat-CVD (Catalytic Chemical Vapor Deposition), sputtering, or the like. For the PECVD, any of RF plasma CVD, VHF plasma CVD having a high frequency, microwave plasma CVD, or the like may be employed. In the present embodiment, a configuration using the RF plasma CVD will be described. For example, as shown in TABLE 1, the i-type amorphous layer 12i can be formed by supplying a silicon-containing gas such as silane (SiH$_4$) diluted by hydrogen, which is turned into plasma by added RF high-frequency electric power to a parallel-plate electrode or like, to a film formation surface of the semiconductor substrate 10 which is heated. In this process, in the present embodiment, gas containing oxygen (O$_2$) is simultaneously introduced at an initial stage of the formation of the i-type amorphous layer 12i, to introduce oxygen to a region near the interface between the semiconductor substrate 10 and the i-type amorphous layer 12i. The gas containing oxygen (O$_2$) may be, for example, carbon dioxide (CO$_2$) gas and oxygen (O$_2$). A substrate temperature during the film formation is set in a range of higher than or equal to 150° C. and lower than or equal to 250° C., and an RF power density is set in a range of greater than or equal to 1 mW/cm$^2$ and less than or equal to 10 mW/cm$^2$.

Figure 2:
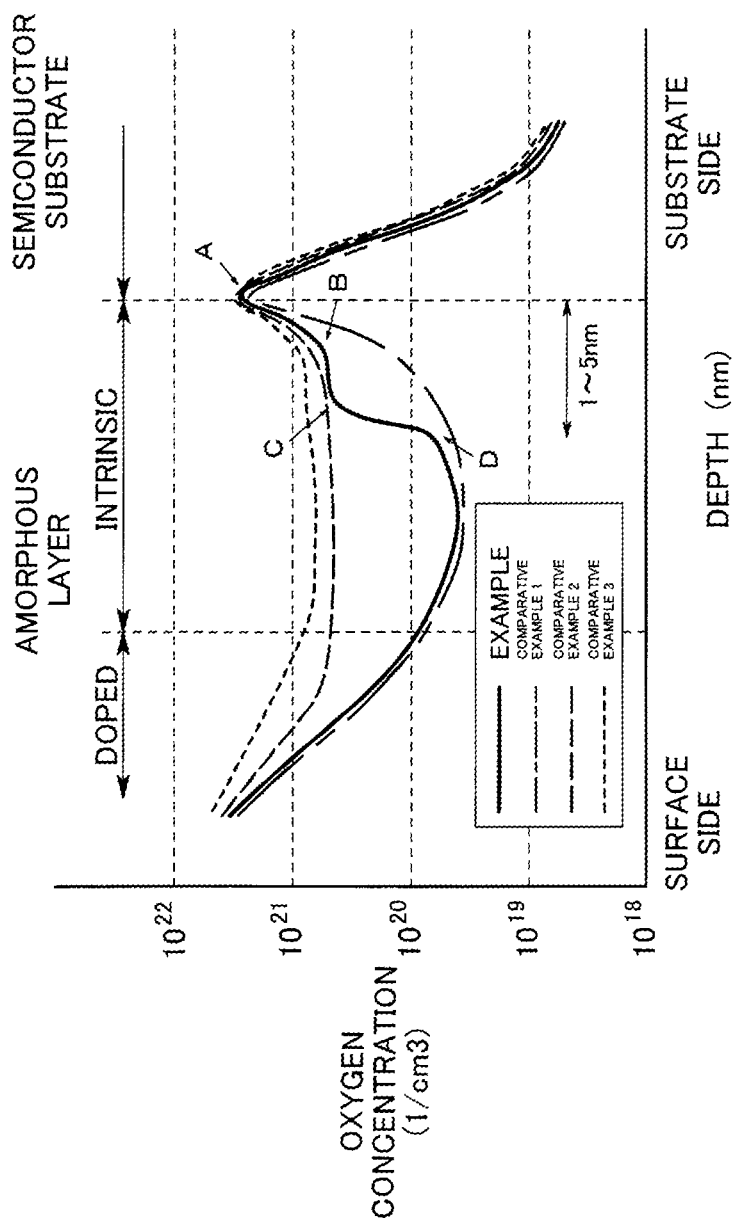
FIG. 2 is a diagram showing an oxygen concentration profile of a photovoltaic device according to a preferred embodiment of the present invention.

As shown in FIG. 2, an oxygen concentration profile is employed in the i-type amorphous layer 12i in which the oxygen concentration is reduced in a step-shape from a region near the interface between the semiconductor substrate 10 and the i-type amorphous layer 12i along the thickness direction of the i-type amorphous layer 12i. For example, a flow rate of the oxygen-containing gas is changed in a step-shape during the formation of the i-type amorphous layer 12i, to form a high-oxygen-concentration region containing a large amount of oxygen only on the side of the interface with the semiconductor substrate 10. The oxygen concentration in the high-oxygen-concentration region is preferably set in a range of greater than or equal to approximately 1×10$^{20}$/cm$^3$ and less than or equal to 1×10$^{21}$/cm$^3$, and the oxygen concentration in regions of the i-type amorphous layer 12i other than the high-oxygen-concentration region is preferably set to be less than approximately 1×10$^{20}$/cm$^3$. In addition, in the high-oxygen-concentration region, a step-shaped profile having one or more steps of oxygen concentrations along the thickness direction is preferably employed. This oxygen concentration profile from the semiconductor substrate 10 and characteristics of the photovoltaic device will be described later.

Concentrations of various elements in a semiconductor film can be measured through secondary ion mass spectrometry (SIMS) or the like. When the texture structure is provided in the semiconductor substrate 10, the concentrations of various elements in the film can be measured by a method in which the resolution in the thickness direction is not reduced by the texture.

The p-type amorphous layer 12p is a layer comprising an amorphous semiconductor film containing a dopant of a p-type conductivity. For example, the p-type amorphous layer 12p is formed by hydrogenated amorphous silicon. The p-type amorphous layer 12p has a higher concentration of the p-type dopant in the film than that of the i-type amorphous layer 12i. For example, the p-type amorphous layer 12p preferably has a concentration of the p-type dopant of greater than or equal to $1\times10^{20}/cm^3$. A thickness of the p-type amorphous layer 12p is preferably sufficiently thin to inhibit absorption of the light as much as possible, and at the same time, sufficiently thick to efficiently separate carriers generated in the semiconductor substrate 10 at the pn junction and to effectively collect the generated carriers in the transparent conductive layer 14. For example, the thickness of the p-type amorphous layer 12p is preferably set in a range of greater than or equal to 1 nm and less than or equal to 10 nm.

The p-type amorphous layer 12p can also be formed through PECVD, Cat-CVD, sputtering, or the like. For the PECVD, RF plasma CVD may be applied. For example, as shown in TABLE 1, the p-type amorphous layer 12p can be formed by supplying a silicon-containing gas such as silane ($SiH_4$) and a p-type dopant-containing gas such as diborane ($B_2H_6$) diluted by hydrogen, which is turned into plasma by applying RF high-frequency electric power to a parallel-plate electrode or like, over the i-type amorphous layer 12i of the semiconductor substrate 10 which is heated. In TABLE 1, diborane ($B_2H_6$) is diluted with hydrogen in a percentage of 1%. A substrate temperature during the film formation is preferably set in a range of higher than or equal to 150° C. and lower than or equal to 250° C., and an RF power density is preferably set in a range of greater than or equal to 1 $mW/cm^2$ and less than or equal to 10 $mW/cm^2$.

The i-type amorphous layer 16i is formed over a back surface of the semiconductor substrate 10. Specifically, after the i-type amorphous layer 12i and the p-type amorphous layer 12p are formed, the semiconductor substrate 10 is flipped to turn the front and back sides over, and the i-type amorphous layer 16i is formed over the back surface of the semiconductor substrate 10. For example, the i-type amorphous layer 16i is an intrinsic hydrogenated amorphous silicon semiconductor layer. Similar to the i-type amorphous layer 12i, a thickness of the i-type amorphous layer 16i is preferably in a range of greater than or equal to 1 nm and less than or equal to 25 nm, and more preferably in a range of greater than or equal to 5 nm and less than or equal to 10 nm.

The i-type amorphous layer 16i can be formed through PECVD, Cat-CVD, sputtering, or the like. For the PECVD, RF plasma CVD may be employed. For example, as shown in TABLE 1, the i-type amorphous layer 16i can be formed by supplying a silicon-containing gas such as silane ($SiH_4$) diluted by hydrogen, which is turned into plasma by applying RF high-frequency electric power to a parallel-plate electrode or like, to a film formation surface of the semiconductor substrate 10 which is heated. Similar to the i-type amorphous layer 12i, a substrate temperature during the film formation is preferably set in a range of higher than or equal to 150° C. and lower than or equal to 250° C., and an RF power density is preferably set in a range of greater than or equal to 1 $mW/cm^2$ and less than or equal to 10 $mW/cm^2$.

In the i-type amorphous layer 16i also, similar to the i-type amorphous layer 12i, gas containing oxygen ($O_2$) is preferably simultaneously introduced during an initial stage of the film formation, to introduce oxygen in a region near an interface between the semiconductor substrate 10 and the i-type amorphous layer 16i.

The n-type amorphous layer 16n is a layer of an amorphous semiconductor film containing a dopant of an n-type conductivity. For example, the n-type amorphous layer 16n is formed by hydrogenated amorphous silicon. The n-type amorphous layer 16n is set to have a higher concentration of the n-type dopant in the film than that of the i-type amorphous layer 16i. For example, the n-type amorphous layer 16n preferably has a concentration of the n-type dopant of greater than or equal to $1\times10^{20}/cm^3$. A thickness of the n-type amorphous layer 16n is preferably sufficiently thin to inhibit absorption of the light as much as possible, and sufficiently thick to effectively separate the carriers generated in the semiconductor substrate 10 by a BSF (Back Surface Field) structure and to efficiently collect the generated carriers in the transparent conductive layer 18. For example, the thickness of the n-type amorphous layer 16n is preferably in a range of greater than or equal to 1 nm and less than or equal to 10 nm.

The n-type amorphous layer 16n can also be formed through PECVD, Cat-CVD, sputtering, or the like. For the PECVD, RF plasma CVD may be employed. For example, as shown in TABLE 1, the n-type amorphous layer 16n can be formed by supplying a silicon-containing gas such as silane ($SiH_4$) and an n-type dopant-containing gas such as phosphine ($PH_3$) diluted by hydrogen, which is turned into plasma by applying RF high-frequency electric power to a parallel-plate electrode or like, over the i-type amorphous layer 16i of the semiconductor substrate 10 which is heated. In TABLE 1, phosphine ($PH_3$) is diluted with hydrogen with a percentage of 2%. A substrate temperature during the film formation is preferably set in a range of higher than or equal to 150° C. and lower than or equal to 250° C., and an RF power density is preferably set in a range of greater than or equal to 1 $mW/cm^2$ and less than or equal to 10 $mW/cm^2$.

It is arbitrary whether to set a front surface side or to set a back surface side of the semiconductor substrate 10 as a light-receiving surface (a surface through which the light is mainly introduced from the outside). In addition, in the above-described embodiment, after the i-type amorphous layer 12i and the p-type amorphous layer 12p on the front surface side are formed, the semiconductor substrate 10 is flipped and the i-type amorphous layer 16i and the n-type amorphous layer 16n on the back surface side are formed, but the order of formation of these layers is also arbitrary.

The transparent conductive layers 14 and 18 are formed over the p-type amorphous layer 12p and the n-type amorphous layer 16n, respectively. The transparent conductive layers 14 and 18 are formed, for example, including at least one of metal oxides having a polycrystalline structure, such as indium oxide ($In_2O_3$), zinc oxide (ZnO), tin oxide ($SnO_2$), and titanium oxide ($TiO_2$), and the metal oxide may be doped with a dopant such as tin (Sn), zinc (Zn), tungsten (W), antimony (Sb), titanium (Ti), cerium (Ce), and gallium (Ga). The transparent conductive layers 14 and 18 may be formed through a thin film formation method such as deposition, plasma-enhanced chemical vapor deposition (PECVD), and sputtering. Thicknesses of the transparent conductive layers 14 and 18 can be suitably adjusted according to the indices of refraction of the transparent conductive layers 14 and 18, and in the present embodiment, the thicknesses are set in a range of greater than or equal to 70 nm and less than or equal to 100 nm.

The collecting electrodes 20 and 22 are formed over the transparent conductive layers 14 and 18, respectively. The collecting electrodes 20 and 22 preferably have a combshaped finger electrode structure. The collecting electrodes 20 and 22 can be formed through screen printing, coating, or the like. The collecting electrodes 20 and 22 are formed, for example, by applying a silver paste or the like to a thickness of a few tens of μm.

EXAMPLE AND COMPARATIVE EXAMPLES 1 To 3

A photovoltaic device having an i-type amorphous layer 12i, having an oxygen concentration profile in which the concentration is reduced in a step-shape from a region near the interface between the semiconductor substrate 10 and the i-type amorphous layer 12i along the thickness direction, and an i-type amorphous layer 16i having an oxygen concentration profile in which the concentration is reduced from a region near the interface between the semiconductor substrate 10 and the i-type amorphous layer 16i along the thickness direction, formed through the above-described formation method and under the conditions shown in TABLE 1, is set as the Example.

A photovoltaic device which was formed similar to the Example except that the oxygen-containing gas such as carbon dioxide gas was not introduced is set as a Comparative Example 1. In addition, a photovoltaic device in which carbonic gas was introduced over the entire period of formation of the i-type amorphous layer 12i and the i-type amorphous layer 16i, so that the entire regions of the i-type amorphous layer 12i and the i-type amorphous layer 16i contain oxygen, is set as a Comparative Example 2. Moreover, a photovoltaic device in which carbon dioxide gas was introduced over the entire period of formation of the i-type amorphous layer 12i, the p-type amorphous layer 12p, the i-type amorphous layer 16i, and the n-type amorphous layer 16n, so that the entire regions of the i-type amorphous layer 12i, the p-type amorphous layer 12p, the i-type amorphous layer 16i, and the n-type amorphous layer 16n contain oxygen, is set as a Comparative Example 3.

FIG. 2 shows the concentration profile of oxygen atoms in the films for the semiconductor substrate 10, the i-type amorphous layer 12i, and the p-type amorphous layer 12p in the Example and in the Comparative Examples 1, 2, and 3. The concentration profiles of oxygen atoms in the film for the semiconductor substrate 10, the i-type amorphous layer 16i, and the n-type amorphous layer 16n were similar. In FIG. 2, a measurement result for the Example is shown with a solid line and the measurement results for the Comparative Examples 1, 2, and 3 are shown with a dot-and-chain line, a broken line, and a two-dots-and-chain line, respectively.

In the case where the oxygen-containing gas such as carbon dioxide gas is not introduced in the i-type amorphous layer 12i and the p-type amorphous layer 12p, such as in the case of the photovoltaic device of the Comparative Example 1, also, oxygen atoms existed in the order of $10^{21}/cm^3$ at the interface region between the semiconductor substrate 10 and the i-type amorphous layer 12i. This is because the surface of the semiconductor substrate 10 is naturally oxidized in a transportation period from cleaning to the formation processes of the i-type amorphous layer 12i and also in the film formation device. Moreover, in a case where a predetermined oxidization process is applied prior to the film formation as described above, the oxygen atoms are also caused due to this process. Because of this, the oxygen concentrations of the i-type amorphous layer 12i and the p-type amorphous layer 12p showed a profile having a peak at the interface with the semiconductor substrate 10, which is reduced to the background level in the i-type amorphous layer 12i, and again increased toward the p-type amorphous layer 12p and the surface. The increase in the oxygen concentration in the p-type amorphous layer 12p can be considered to be an influence of introduction of the doping gas and an influence on the surface condition in the measurement.

In the case where the oxygen-containing gas was introduced to the entire region of the i-type amorphous layer 12i, such as in the case of the photovoltaic device of the Comparative Example 2, oxygen existed in a concentration of greater than or equal to approximately $1\times10^{20}/cm^3$ in the i-type amorphous layer 12i. Similarly, in the photovoltaic device of the Comparative Example 3 also, oxygen existed in a concentration of greater than or equal to approximately $1\times10^{20}/cm^3$ in the i-type amorphous layer 12i. The oxygen concentration was slightly higher in the Comparative Example 3 than in the Comparative Example 2.

On the other hand, in the photovoltaic device of the Example, a peak of the oxygen concentration existed in the interface region with the semiconductor substrate 10 for a similar reason to that in the Comparative Example 1. However, because the i-type amorphous layer 12i was formed while controlling introduction of the oxygen-containing gas in steps, a region containing a large amount of oxygen (high-oxygen-concentration region) near the interface with the semiconductor substrate 10 was observed in a range of less than or equal to 5 nm from the interface with the semiconductor substrate 10. The oxygen concentration in the high-oxygen-concentration region was in a range of greater than or equal to approximately $1\times10^{20}/cm^3$ and less than or equal to $1\times10^{21}/cm^3$. In addition, in the i-type amorphous layer 12i, the oxygen concentration in regions other than the high-oxygen-concentration region was less than approximately $1\times10^{20}/cm^3$.

Moreover, the high-oxygen-concentration region had a profile of a step-shape having one or more steps of oxygen concentrations along the thickness direction. In other words, the oxygen concentration profile near the interface with the semiconductor substrate 10 in the i-type amorphous layer 12i had one or more points of inflection, and had regions having different slopes. More specifically, there had been confirmed, as the inflection points, a point A which is at the interface between the semiconductor substrate 10 and the i-type amorphous layer 12i and having an oxygen concentration in the order of $10^{21}/cm^3$, a point B in the i-type amorphous layer 12i and in a range of about 1 nm from the interface between the semiconductor substrate 10 and the i-type amorphous layer 12i, and having an oxygen concentration in a range of greater than or equal to approximately $1\times10^{20}/cm^3$ and less than or equal to $1\times10^{21}/cm^3$, a point C in the i-type amorphous layer 12i and in an approximate range of greater than or equal to 1 nm and less than or equal to 5 nm from the interface between the semiconductor substrate 10 and the i-type amorphous layer 12i, and having an oxygen concentration in a range of greater than or equal to approximately $1\times10^{20}/cm^3$ and less than or equal to $1\times10^{21}/cm^3$, and a point D in the i-type amorphous layer 12i and distanced from the interface between the semiconductor substrate 10 and the i-type amorphous layer 12i by about 5 nm and having an oxygen concentration of less than or equal to approximately $1\times10^{20}/cm^3$. Such an oxygen concentration profile was more clearly confirmed when the concentration axis was shown logarithmically.

The oxygen concentration of approximately $1\times10^{20}/cm^3$ technically has the following critical meaning. Because the density of the silicon atoms in the i-type amorphous layer 12i is approximately $5\times10^{22}/cm^3$, when the oxygen concentration is approximately $1\times10^{20}/cm^3$, the concentration ratio of the oxygen atoms with respect to the silicon atoms is 0.002. With a value near this value as a boundary, it can be considered that when the oxygen concentration is lower than 0.002, the oxygen atoms act as impurities in silicon, and when the oxygen concentration is higher than 0.002, the oxygen atoms are alloyed with silicon and the film has properties as a compound of oxygen and silicon. Therefore, the properties of the i-type amorphous layer 12i can be considered to change with the boundary at the oxygen concentration of approximately $1 \times 10^{20}/cm^3$. As the oxygen atoms in the semiconductor layer of the present embodiment have a very low carrier activation percentage, the amorphous layer 12i containing oxygen in the concentration according to the present embodiment is substantially intrinsic.

Figure 3:
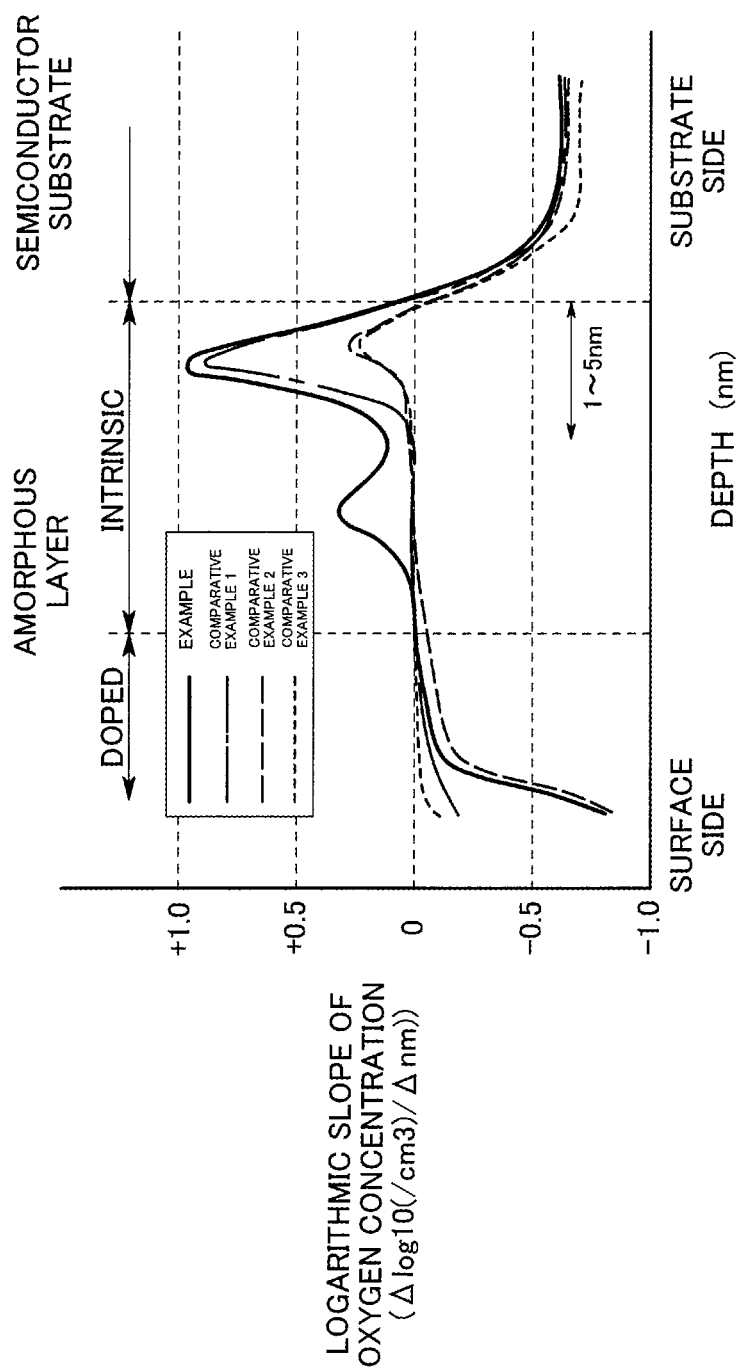
FIG. 3 is a diagram showing a slope profile in a logarithmic scale of an oxygen concentration of a photovoltaic device according to a preferred embodiment of the present invention.

FIG. 3 shows a slope profile, shown in a logarithmic scale, of the oxygen concentration obtained by differentiating the oxygen concentration profile of FIG. 2 in the thickness direction. In FIG. 3, the Example is shown with a solid line and the Comparative Examples 1, 2, and 3 are shown with a dot-and-chain line, a broken line, and a dotted line, respectively.

In the Comparative Examples 1-3, the oxygen concentration profile changes gradually in a large portion in the i-type amorphous layer 12i, and has a steep peak at the interface between the semiconductor layer 10 and the i-type amorphous layer 12i. Therefore, the oxygen concentration slope had a value close to 0 in the i-type amorphous layer 12i and in the p-type amorphous layer 12p except for the region near the interface between the semiconductor substrate 10 and the i-type amorphous layer 12i. In addition, as the position approaches the semiconductor substrate 10 from the surface side, the slope was rapidly increased from a point which is a few nm away from the interface between the semiconductor substrate 10 and the i-type amorphous layer 12i, the slope became 0 near the interface, and became a negative value in the semiconductor substrate 10.

On the other hand, in the photovoltaic device of the Example, as the position approaches the semiconductor substrate 10 from the surface side, the slope was increased from a shallow position in the i-type amorphous layer 12i and showed a peak. The slope then became gradual and approaches 0, and the slope was again increased from a point distanced from the interface between the semiconductor substrate 10 and the i-type amorphous layer 12i by a few nm. Thus, the profile of the slope of the oxygen concentration had at least two peaks within the i-type amorphous layer 12i.

The above-described tendency was similarly observed in the concentration profiles of oxygen atoms in the film for the semiconductor substrate 10, the i-type amorphous layer 16i, and the n-type amorphous layer 16n.

TABLE 2 shows output characteristics of photovoltaic devices of the Example and the Comparative Examples 1 to 3. Measured data were an open-circuit voltage (Voc), a short-circuit current (Isc), a fill factor (FF), and an output power (Pmax). In TABLE 2, normalized values which were normalized against the values in the Comparative Example 1 as 1 are shown.

TABLE 2

|  | OPEN-CIRCUIT VOLTAGE Voc | SHORT-CIRCUIT CURRENT Isc | FILL FACTOR FF | OUTPUT Pmax |
|---|---|---|---|---|
| EXAMPLE | 1.01 | 1.005 | 1.00 | 1.015 |
| COMPARATIVE EXAMPLE 1 | 1.00 | 1.000 | 1.00 | 1.000 |
| COMPARATIVE EXAMPLE 2 | 1.01 | 1.005 | 0.98 | 0.995 |
| COMPARATIVE EXAMPLE 3 | 1.01 | 1.005 | 0.96 | 0.975 |

An improvement of the open-circuit voltage can be confirmed in the Example and in the Comparative Examples 2 and 3 compared with the Comparative Example 1 in which the oxygen atoms are not intentionally introduced into the i-type amorphous layers 12i and 16i. Specifically, the open-circuit voltage was improved by about 1%. This can be deduced to be caused by the fact that because the oxygen concentration is higher in the i-type amorphous layers 12i and 16i in regions near the interface with the semiconductor substrate 10 in the Example and the Comparative Examples 2 and 3 compared with the Comparative Example 1, defects at the interfaces between the semiconductor substrate 10 and the i-type amorphous layers 12i and 16i were effectively passivated (terminated), and re-combination of carriers with the defect acting as the re-combination center was inhibited.

The short-circuit current Isc was higher in the Example and in the Comparative Examples 2 and 3 compared with the Comparative Example 1. Specifically, an improvement of 0.5%-1% was observed. This can be deduced to be caused by the fact that, because the oxygen concentration is higher in the i-type amorphous layers 12i and 16i in regions near the interfaces with the semiconductor substrate 10 in the Example and in the Comparative Examples 2 and 3 compared with the Comparative Example 1, optical bandgaps in these regions of the i-type amorphous layers 12i and 16i were widened and the light transmittance was increased, and consequently, the amount of transmission of light to the semiconductor substrate 10 which is the carrier generation layer was increased and the short-circuit current Isc was increased.

With regard to the fill factor FF, no significant difference was observed between the Comparative Example 1 and the Example. However, in the Comparative Example 2 in which oxygen was intentionally introduced in the entire region of the i-type amorphous layers 12i and 16i and in the Comparative Example 3 in which oxygen was intentionally introduced in the entire region of the p-type amorphous layer 12p and the n-type amorphous layer 16n, reduction of the fill factor FF was observed compared with the Comparative Example 1 and the Example. This can be deduced as being caused by the fact that when excessive oxygen atoms are contained in the i-type amorphous layers 12i and 16i, the p-type amorphous layer 12p, and the n-type amorphous layer 16n, the oxygen atoms may act as an impurity and form defects or acts as an electrically resistive layer. In contrast, as in the Example, when oxygen was contained in a range of 5 nm from the interfaces between the semiconductor substrate 10 and the i-type amorphous layers 12i and 16i, the increase in the resistance is not high, and the fill factor FF is not degraded. In addition, there is a correlation between the fill factor FF and the open-circuit voltage Voc, and it can be deduced that the influence due to the improvement of the open-circuit voltage Voc is higher than the influence of the increase of the high-resistance layer.

As a result of the above described observations, the output power Pmax was maximum in the Example. In other words, it can be deduced that with the reduction of defects near the interface with the semiconductor substrate 10 and effective introduction of light into the semiconductor substrate 10, the open-circuit voltage Voc and the short-circuit current Isc were improved, and with inhibition of the reduction of the fill factor FF, the power generation efficiency was improved.

EXAMPLE AND COMPARATIVE EXAMPLES 4 And 5

In the Example, oxygen concentrations at point B and point C in FIG. 2 were set to be greater than or equal to $1\times10^{20}/cm^3$ and less than or equal to $1\times10^{21}/cm^3$. A photovoltaic device in which the oxygen concentrations at point B and point C in FIG. 2 were set to be greater than $1\times10^{21}/cm^3$ was set as a Comparative Example 4, and a photovoltaic device in which the oxygen concentrations at point B and point C were set to be less than $1\times10^{20}/cm^3$ was set as a Comparative Example 5.

TABLE 3 shows output characteristics of the photovoltaic devices of the Example and the Comparative Examples 4 and 5. Similar to TABLE 2, the measured data were open-circuit voltage (Voc), short-circuit current (Isc), fill factor (FF), and output power (Pmax), and normalized values which are normalized against the values of the Example as 1 are shown.

TABLE 3

| | OPEN-CIRCUIT VOLTAGE Voc | SHORT-CIRCUIT CURRENT Isc | FILL FACTOR FF | OUTPUT Pmax |
|---|---|---|---|---|
| EXAMPLE | 1.00 | 1.00 | 1.00 | 1.00 |
| COMPARATIVE EXAMPLE 4 | 1.00 | 1.01 | 0.95 | 0.96 |
| COMPARATIVE EXAMPLE 5 | 0.98 | 0.99 | 1.00 | 0.97 |

Compared with the Example, no significant improvement was observed in the open-circuit voltage Voc for the Comparative Example 4, and a reduction of the open-circuit voltage Voc was observed in the Comparative Example 5. Thus, it can be considered that the Example has the optimum oxygen concentration profile, and the advantage of the improvement of the open-circuit voltage Voc cannot be improved even when oxygen atoms are contained in an amount greater than the optimum amount. In addition, a case may be possible in which elements other than oxygen contained in the oxygen-containing gas (for example, carbon in the case where carbon dioxide gas is used) may be simultaneously introduced into the i-type amorphous layers 12i and 16i, which then may form the defects and cause reduction of the open-circuit voltage Voc.

On the other hand, with regard to the fill factor FF, a significant reduction was observed in the Comparative Example 4 compared with the Example. It can be deduced that even when the oxygen is excessively contained only in the range up to 5 nm from the interfaces between the semiconductor substrate 10 and i-type amorphous layers 12i and 16i, the region would act as a high-resistance region, and the fill factor FF is reduced.

In the embodiment, a configuration is described in which oxygen is introduced to both the i-type amorphous layer 12i and the i-type amorphous layer 16i, but a significant advantage can be obtained by introducing oxygen to at least one of the i-type amorphous layer 12i and the i-type amorphous layer 16i.

What is claimed is:

1. A photovoltaic device comprising:
a crystalline semiconductor substrate of a first conductive type;
a first amorphous semiconductor layer which is intrinsic and formed over a first surface of the semiconductor substrate; and
a second amorphous semiconductor layer of the first conductive type or of a conductive type opposite of the first conductive type and formed over the first amorphous semiconductor layer, wherein
an oxygen concentration in a high-oxygen-concentration region within 5 nm near the interface between the semiconductor substrate and the first amorphous semiconductor layer is greater than or equal to $1\times10^{20}/cm^3$ and less than or equal to $1\times10^{21}/cm^3$,
wherein a profile of the oxygen concentration in the high-oxygen concentration region is reduced in a step shape near an interface with the semiconductor substrate along a thickness direction, and a slope of the profile has at least two peaks,
and wherein an oxygen concentration in regions in the first amorphous semiconductor layer other than the high-oxygen-concentration region is less than $1\times10^{20}/cm^3$.

2. The photovoltaic device according to claim 1, further comprising:
a third amorphous semiconductor layer which is intrinsic and formed over a second surface, opposite to the first surface, of the semiconductor substrate; and
a fourth amorphous semiconductor layer of an opposite conductive type to that of the second amorphous semiconductor layer and formed over the third amorphous semiconductor layer, wherein
a profile of the oxygen concentration is reduced in a step shape near an interface with the semiconductor substrate along a thickness direction, and a slope of the profile has at least two peaks.

3. A photovoltaic device comprising:
a crystalline semiconductor substrate; and an amorphous semiconductor layer formed over the crystalline semiconductor substrate;
wherein an oxygen concentration in a high-oxygen-concentration region within 5 nm near the interface between the crystalline semiconductor substrate and the amorphous semiconductor layer is greater than or equal to $1\times10^{20}/cm^3$ and less than or equal to $1\times10^{21}/cm^3$,
wherein a profile of the oxygen concentration in the high-oxygen concentration region is reduced in a step shape near an interface with the semiconductor substrate along a thickness direction, and a slope of the profile has at least two peaks,
and wherein an oxygen concentration in regions in the amorphous semiconductor layer other than the high-oxygen-concentration region is less than $1\times10^{20}/cm^3$.

* * * * *